US007682691B2

(12) United States Patent
Akaho et al.

(10) Patent No.: US 7,682,691 B2
(45) Date of Patent: Mar. 23, 2010

(54) RESIN COMPOSITION OF LAYERED SILICATE

(75) Inventors: Kazunori Akaho, Takatsuki (JP); Koji Yonezawa, Osaka (JP); Motohiro Yagi, Kyoto (JP); Akihiko Fujiwara, Izumi (JP); Koichi Shibayama, Kawanishi (JP); Hidenobu Deguchi, Takatsuki (JP)

(73) Assignee: Sekisui Chemical Co., Ltd., Osaka (JP)

( * ) Notice: Subject to any disclaimer, the term of this patent is extended or adjusted under 35 U.S.C. 154(b) by 462 days.

(21) Appl. No.: 10/503,490

(22) PCT Filed: Feb. 4, 2003

(86) PCT No.: PCT/JP03/01090

§ 371 (c)(1),
(2), (4) Date: Aug. 5, 2004

(87) PCT Pub. No.: WO03/066741

PCT Pub. Date: Aug. 14, 2003

(65) Prior Publication Data

US 2005/0107497 A1    May 19, 2005

(30) Foreign Application Priority Data

Feb. 6, 2002   (JP)   ............... 2002-029783
May 14, 2002   (JP)   ............... 2002-139090
May 30, 2002   (JP)   ............... 2002-158210
May 30, 2002   (JP)   ............... 2002-158211
Sep. 30, 2002  (JP)   ............... 2002-287005

(51) Int. Cl.
B32B 27/20   (2006.01)
B32B 27/18   (2006.01)
C08K 3/34    (2006.01)

(52) U.S. Cl. ............... 428/339; 428/323; 428/327; 428/332; 523/440; 523/443; 523/486; 524/492; 524/493

(58) Field of Classification Search ............... 523/400, 523/440, 443, 466; 524/492, 493, 588; 428/221, 428/323, 327, 332, 339, 413, 414, 447, 448, 428/473.5
See application file for complete search history.

(56) References Cited

U.S. PATENT DOCUMENTS

| 4,851,021 A | 7/1989 | Bohrn et al. |
| 5,801,216 A * | 9/1998 | Pinnavaia et al. ............ 523/209 |
| 2004/0053061 A1 * | 3/2004 | Yonezawa et al. ............ 428/458 |
| 2005/0191490 A1 * | 9/2005 | Ton-That et al. ............ 428/407 |

FOREIGN PATENT DOCUMENTS

| CA | 2429683 A1 | 6/2002 |
| CN | 1415659 A | 5/2003 |
| EP | 1 350 815 A | 10/2003 |
| JP | 63-221168 | 9/1988 |
| JP | 63-242915 | 10/1988 |
| JP | 06-107958 | 4/1994 |
| JP | 09-152522 | * 6/1997 |
| JP | 09-227680 | * 9/1997 |
| JP | 10-146917 | 6/1998 |
| JP | 11-349709 | * 12/1999 |
| JP | 2000-119422 | 4/2000 |
| JP | 2000-183539 | * 6/2000 |
| JP | 2001-004850 | * 1/2001 |
| JP | 2001-019834 | 1/2001 |
| JP | 2001-108854 | * 4/2001 |
| JP | 2001-156461 A | 6/2001 |
| JP | 2001-183539 | * 7/2001 |
| JP | 2001-323167 | * 11/2001 |
| JP | 2001-329080 | 11/2001 |
| JP | 2002-220513 | * 8/2002 |
| JP | 2002-36387 | 12/2002 |
| JP | 2002-363386 | 12/2002 |
| JP | 2003-096315 | 4/2003 |
| JP | 2004-176031 | 6/2004 |
| KR | 1999-87161 A | 12/1999 |
| WO | 98/45741 A1 | 10/1998 |
| WO | WO 00/34378 A | 6/2000 |
| WO | WO 02/46312 A1 * | 6/2002 |

OTHER PUBLICATIONS

International laid open gazette of WO97/31057 dated Aug. 28, 1997.
JP 2000-183539 A, filed Dec. 18, 1998, English Abstract thereof.
JP 2001-183539 A, filed Dec. 12, 1999, English Abstract thereof.
JP 9-152522 A, filed Nov. 30, 1995, English Abstract thereof.
JP 2002-220513 A, filed Jan. 26, 2001, English Abstract thereof.
Hitachi Technical Report No. 37 (Jul. 2001) pp. 7-16 entitled "Trend In Optical Fiber Communications Technology And the Expected Role of Materials and Components in Developing FTTH".
JP 2843314 (JP 9-227680 A), filed Mar. 4, 1997, English Abstract thereof.
JP 2001-108854 A, filed Mar. 22, 2000, English Abstract thereof.
JP 2001-4850 A, filed Jun. 17, 1999, English Abstract thereof.
JP 2001-323167 A (English Abstract thereof) (2001).
JP 11-349709 A (English Abstract thereof) (1999).
International Search Report in PCT/JP03/01090 (2003).

* cited by examiner

*Primary Examiner*—Michael J Feely
(74) *Attorney, Agent, or Firm*—Townsend & Banta

(57) ABSTRACT

A resin composition, substrate material, sheet, laminated board, resin-bearing copper foil, copper-clad laminate, TAB tape, printed board, prepreg and adhesive sheet are provided which exhibit improved mechanical properties, dimensional stability, heat resistance and flame retardance, particularly high-temperature physical properties. The resin composition containing 100 parts by weight of a thermosetting resin and 0.1-65 parts by weight of a layered silicate inorganic compound, the resin composition having a mean linear expansion coefficient ($\alpha 2$) of up to $17 \times 10^{-3}$ [° C.$^{-1}$] over the temperature range from a temperature 10° C. higher than a glass transition temperature of the resin composition to a temperature 50° C. higher than the glass transition temperature of the resin composition.

24 Claims, No Drawings

RESIN COMPOSITION OF LAYERED SILICATE

TECHNICAL FIELD

The present invention relates to a resin composition, substrate material, sheet, laminated board, resin-bearing copper foil, copper-clad laminate, TAB tape, printed circuit board, prepreg and adhesive sheet, which exhibit improved physical properties, dimensional stability, heat resistance and flame retardance, particularly high-temperature physical properties.

BACKGROUND ART

As recent technology continues to rapidly increase performance, operation and compactness levels of electronic devices, there is an increasing demand to further reduce sizes and weights of electronic parts for use in electronic devices. This also demands to further improve properties, e.g., heat resistance, mechanical strength and electrical properties of electronic part materials. For example, high levels of density, operation and performance are required for methods of packaging semiconductor devices and for wiring boards mounting such semiconductor devices.

A multilayer printed circuit board generally includes plural layers of insulating substrates. For these interlayer insulating substrates, thermosetting resin prepregs including thermosetting resins impregnated in a glass cloth and films composed of thermosetting resins or photosetting resins have been conventionally used, for example. It is to be desired that the multilayer printed circuit board has a considerably narrow interlayer spacing to increase its density as well as reduce its thickness. This raises a need for an interlayer insulating substrate either with or without a thin glass cloth. Examples of materials known to constitute such an interlayer insulating substrate include rubbers (elastomers), thermosetting resins modified with acrylic resins or others, thermoplastic resins incorporating a large amount of inorganic fillers and the like. In Japanese Patent Laying-Open No. 2000-183539, a method is disclosed for manufacturing a multilayer insulating substrate by incorporating an inorganic filler having a specific range of particle diameters into a varnish comprised chiefly of a high-molecular epoxy polymer and a polyfunctional epoxy resin and coating the resultant onto a substrate to form an insulating layer thereon.

However, the multilayer insulating substrate made by the above-specified manufacturing method must incorporate a large amount of inorganic filler in order to insure a sufficient interfacial contact area between the inorganic filler and the high-molecular epoxy polymer or polyfunctional epoxy resin to improve mechanical strength and other physical properties. This in some cases adds to manufacturing process steps or other inconveniences from the processing point of view and in other cases results in the difficulty to reduce an interlayer spacing, which have been problems.

The thin interlayer insulating substrate, either with or without a thin glass cloth, shows insufficient heat resistance and dimensional stability and often causes inconveniences during a manufacturing process because it is brittle and easy to break, which have been problems.

The multilayer printed circuit board is fabricated such as by a buildup method wherein a sequence of forming a circuit on a layer and superimposing another layer on the circuit is repeated to build up a laminated board, or by a single-operation stacking method wherein circuit-formed layers are stacked together in a single operation. Due to the increased number of processes in either fabrication method, the quality of the material used affects largely on the yield. Due also to inclusion of plating, curing and solder reflowing processes, the material needs to have sufficient solvent resistance, water resistance, heat resistance and high-temperature dimensional stability. Specific examples of such requirements include resistance to acids, alkalis and organic solvents; reduction of moisture absorption that affects electrical properties; high-temperature and post-heating dimensional stability that affects high-precision circuit connection between upper and lower layers; heat resistance up to 260° C. that is required for mounting by lead-free soldering; and reduced occurrence of copper migration that affects reliability of connections.

For example, buildup substrates for use in IC packages and multilayer printed substrates may be placed under high temperature conditions due to heat build-up, but they are still required to maintain high reliability under such conditions. However, a dimensional change of the resin when exposed to high temperatures, if large, causes separation thereof from a metal wiring such as circuit-forming copper to result in occurrence of short-circuiting or wire breaking, which has been a problem. The similar problem occurs even in the flexible multilayer substrate noticed recently as a thin sheet substrate, if an adhesive layer bonding flexible single-layer substrates to each other, a polyimide film constituting the flexible substrate and a metal wiring such as circuit-forming copper differ largely from each other by the degree of dimensional change that they undergo when exposed to heat.

Japanese Patent Laying-Open No. 2000-183539 discloses a technique for improving high-temperature properties by using, in combination, an epoxy resin having superior heat resistance and an inorganic compound. Although the property improving effect is slightly observed at temperatures below a glass transition temperature, it is little observed at temperatures above the glass transition temperature. Neither of moisture absorbency and solvent resistance improving effects can be expected.

Loading of an inorganic filler has been conventionally known to reduce a linear expansion coefficient. This technique is however inapplicable to solder reflowing and other high-temperature treatments. Recent attention to environment has led to the use of a lead-free solder. Since the solder reflowing process temperature continues to increase, the mere use of a highly heat-resistance resin results in the occurrence of inconveniences during high-temperature treatments. That is, the increased linear expansion coefficient of the resin at temperatures above the glass transition temperature causes such inconveniences.

The recent progress of optical communication technology demands an inexpensive way of connecting optical communication devices. Under such circumstances, polymeric optical communication materials have attracted attention. However, the use of conventional polymers as the optical communication materials creates various problems.

The polymeric optical communication material need to be low in loss, superior in heat resistance, low in linear expansion coefficient and low in moisture permeability. Also, they must be readily controllable in refractive index.

By "low in loss", it is meant that the polymeric material has substantially no absorption band in the wavelength range for use in the optical communication and is thus low in propagation loss.

Japanese Patent Laying-Open No. 2001-183539 describes that conventional polymeric materials exhibit approximately ten times the thermal expansion coefficient of semiconductor or metal material. It also describes that polymeric optical communication material, when formed on a silicon or other substrate having a low thermal expansion coefficient, produces a stress which causes unfavorable results, e.g., polarization dependence of the optical communication material, warpage of the optical communication material and substrate, or separation of the polymeric optical communication material from the substrate.

WO98/45741 describes a problem of a difference in thermal expansion coefficient between an optical fiber (quartz glass) and a resin case that causes the optical fiber to project from a jacket or crack by stress concentration.

Japanese Patent Laying-Open No. Hei 9-152522 describes the case where an optical waveguide substrate is adhesively joined to an optical fiber. A difference in thermal expansion between the optical waveguide substrate and a connector part, if large, is described to cause positional shift during thermal expansion to result in the failure to achieve stable connection to an optical waveguide.

Concerning the moisture permeability, WO 98/45741 describes that a water vapor, if permitted to penetrate into an interior of a hollow case, condenses on a surface of an optical element or fiber to a liquid which problematically causes corrosion of the optical element or promotes growth of cracks leading to breaking of the optical fiber. It also describes that these factors and thermal expansion together lowers reliability of optical communication parts made of polymeric material. Also, the increased moisture absorbency increases the occurrence of light absorption based on an O—H bond of a moisture. This also addresses a need for a material which is low in moisture absorbency.

In order to introduce optical communication to terminal equipments, optical signals must be converted to or from electric signals. In such a case, polymeric optical communication material is used in a printed circuit board or in its vicinities. It is then required that the polymeric optical communication material should show resistance to process temperature during manufacture of a printed substrate as well as to heat radiated from an electric circuit while in use Hitachi Technical Report No. 37 (July, 2001), at pages 7-16, describes solder heat resistance as a prescribed property.

As described above, the optical communication material is expected to have such properties as transparency, heat resistance, low linear expansion coefficient and low moisture absorbency.

Japanese Patent Registration No. 2843314 describes that fluorinated polyimide having a rigid and straight skeleton exhibits a low coefficient of linear thermal expansion.

Japanese Patent Laying-Open No. 2001-108854 discloses a polymeric optical waveguide comprised of a core layer, a clad layer surrounding the core layer and a second clad layer located outside the clad layer and having a lower thermal expansion coefficient than the clad layer. This reference describes that a difference in thermal expansion coefficient between the polymeric optical waveguide and an electric or optical element can be reduced by using different polymers for the clad lay and second clad layer so that the second clad layer has a relatively lower thermal expansion coefficient relative to the clad layer.

Japanese Patent Laying-Open No. 2001-183539 describes an optical communication medium comprised of an insulation film and a substrate and sealed at its ends with a resin which joins them together. This construction is described to prevent the insulating film and substrate from separating from each other at the ends of the medium where stress concentration is likely to occur.

Japanese Patent Laying-Open No. 2001-4850 also describes that the use of a polyimide film having a specific structure for an optical wavelength resin effectively lowers a thermal expansion coefficient.

However, the fluorinated polyimide described in Japanese Patent Registration No. 2843314 is not suitable for use as a clad layer material of the optical communication device because it exhibits lower transparency compared to the other types of polyimides and has a high refractive index of 1.647.

It is suggested in Japanese Patent Laying-Open No. 2001-108854 that an optical wavelength resin containing the particles described therein may satisfy both the low linear expansion coefficient and required transparency. However, the particles must be added in a large amount to actually achieve reduction of linear expansion coefficient. Addition of such a large amount of the particles makes it difficult to achieve sufficient transparency, problematically provides a brittle and weak resin composition, and increases hydrophilicity and moisture absorbency.

The constitution described in Japanese Patent Laying-Open No. 2001-183539 adds to process steps. This inevitably pushes a cost up.

The specifically structured polyimide film described in Japanese Patent Laying-Open No. 2001-4850, when used as an optical wavelength resin, has been found to be difficult to achieve reduction in moisture absorbency, although possible to achieve reduction in thermal expansion coefficient. As a consequence, the cost associated with its use becomes high.

Therefore, it has been difficult to realize an optical circuit forming material which exhibits superior transparency, particularly high transparency, superior heat resistance, low coefficient of linear expansion and low moisture absorbency.

Japanese Patent Laying-Open No. 2002-220513 describes a resin sheet obtained by impregnating a resin containing an inorganic filler into a glass sheet. The obtained resin sheet is described to exhibit a low linear expansion coefficient. However, the actually resulting linear expansion coefficient was not much more than that expected from the use of the glass sheet. Also, an inorganic filler is loaded in the amount of 7% by weight, at maximum, in Examples. The specification provides insufficient description as to a method of dispersing the inorganic filler. It is accordingly hard to find that the inorganic filler is dispersed very finely in the resin.

DISCLOSURE OF THE INVENTION

In view of the current state of the art, it is an object of the present invention to provide a resin composition, substrate material, sheet, laminated board, resin-bearing copper foil, copper-clad laminate, TAB tape, printed circuit board, prepreg and adhesive tape, which are all excellent in mechanical properties, dimensional stability, heat resistance and flame retardancy, particularly in high-temperature physical properties.

It is another object of the present invention to provide a resin composition useful for provision of an optical circuit forming material which exhibits improved transparency and heat resistance and low levels of linear expansion coefficient and moisture absorbency, particularly high transparency.

The present invention is a resin composition which contains 100 parts by weight of a thermosetting resin and/or a photocurable resin and 0.1-65 parts by weight of an inorganic compound and which has a mean linear expansion coefficient ($\alpha 2$) of $17 \times 10^{-5}$ [$^\circ$ C.$^{-1}$] or below over the temperature range from a temperature 10$^\circ$ C. higher than a glass transition temperature of the resin composition to a temperature 50$^\circ$ C. higher than the glass transition temperature of the resin composition.

The present invention is below described in detail.

The resin composition of the present invention has a mean linear expansion coefficient (may also be hereinafter referred to as α2) of 17×10$^{-5}$ [° C.$^{-1}$] or below over the temperature range from a temperature 10° C. higher than the glass transition temperature (may also be hereinafter referred to as Tg) of the resin composition to a temperature 50° C. higher than the glass transition temperature of the resin composition. Because of its mean linear expansion coefficient that does not exceed 17×10$^{-5}$ [° C.$^{-1}$], a resin material comprised of the resin composition of the present invention shows a reduced dimensional change when heat treated at high temperatures and, when laminated with a copper foil or the like, can avoid the occurrence of warpage or separation that may result from the difference in shrinkage factor from the copper foil or the like. The mean linear expansion coefficient of the resin composition is preferably 15×10$^{-5}$ [° C.$^{-1}$] or below, more preferably 12×10$^{-5}$ [° C.$^{-1}$] or below. The mean linear expansion coefficient can be measured by a method according to JIS K 7197. For example, the mean linear expansion coefficient can be determined by heating an about 3 mm×15 mm test piece at a rate of 5° C./min using a TMA (thermomechanical analysis) instrument (product of Seiko Instruments Inc., TMA/SS 120 C).

Preferably, the resin composition of this invention exhibits a mean linear expansion coefficient ratio (α2/α1) of up to 2, where the mean linear expansion coefficient ratio is calculated by dividing the above-specified α2 by a mean linear expansion coefficient (may also be hereinafter referred to as α1) over the temperature range from a temperature 50° C. lower than a Tg of the resin composition to a temperature 10° C. lower than the Tg of the resin composition. If this mean linear expansion coefficient ratio is within 2, a resin material comprised of the resin composition of the present invention shows a reduced dimensional change at near Tg and, when laminated with the other material, can avoid the occurrence of warpage or wrinkle at near Tg. The mean linear expansion coefficient ratio is more preferably up to 1.85, further preferably up to 1.75.

Preferably, the resin composition of this invention has a mean linear expansion coefficient which does not exceed 10×10$^{-5}$ [° C.$^{-1}$] over the 50-100° C. temperature range and does not exceed 25×10$^{-5}$ [° C.$^{-1}$] over the 200-240° C. temperature range. If its mean linear expansion coefficient is within 10×10$^{-5}$ [° C.$^{-1}$] over the 50-100° C. temperature range and within 25×10$^{-5}$ [° C.$^{-1}$] over the 200-240° C. temperature range, a resin material comprised of the resin composition of this invention shows a reduced dimensional change under normal use conditions. It is accordingly suitable for use in an electronic material which must be precisely dimensioned. Also, the occurrence of warpage or separation can be avoided during fabrication and other processes which involve high-temperature treatments such as solder reflowing. The mean linear expansion coefficient of the resin composition over the 50-100° C. temperature range is more preferably within 8×10$^{-5}$ [° C.$^{-1}$], further preferably within 6×10$^{-5}$ [° C.$^{-1}$]. The mean linear expansion coefficient of the resin composition over the 200-240° C. temperature range is more preferably within 20×10$^{-5}$ [° C.$^{-1}$], further preferably within 15×10$^{-5}$ [° C.$^{-1}$].

Preferably, the resin composition of this invention exhibits a mean linear expansion coefficient ratio (1) of up to 2.5 and a mean linear expansion coefficient ratio (2) of up to 4.5, where the former ratio is calculated by dividing a mean linear expansion coefficient over the 150-200° C. temperature range by that over the 50-100° C. temperature range and the latter ratio is calculated by dividing a mean linear expansion coefficient over the 250-300° C. temperature range by that over the 50-100° C. temperature range. If the mean linear expansion coefficient ratio (1) is within 2.5 and the mean linear expansion coefficient ratio (2) is within 4.5, a resin material comprised of the resin composition of this invention exhibits good dimensional stability against heating. Also, warpage or separation thereof is maintained at a low degree of occurrence during fabrication and other processes which involve high-temperature treatment such as reflowing of lead-free solder. Accordingly, such a resin material is suitable for high-temperature uses. The mean linear expansion coefficient ratio (1) is more preferably up to 2.2 and further preferably up to 2.0. The mean linear expansion coefficient ratio (2) is more preferably up to 4.0 and further preferably up to 3.5.

The resin composition of the present invention preferably exhibits a rate of change of up to 5%, where the rate of change is calculated by dividing a change in length of a resin piece comprised of the resin composition when heated from 25° C. to 300° C. by a length of the resin piece at 25° C. If the defined rate of change is within 5%, a resin material comprised of the resin composition of the present invention shows improved dimensional stability against temperature and, when laminated with the other material, can avoid occurrence of warpage or separation while in fabrication or in use. The above-defined rate of change is more preferably within 4.5%, further preferably within 4%.

Preferably, the resin composition of this invention exhibits a value of up to 1.05 for a mean linear expansion coefficient ratio (3) as determined by the following equation (1):

Mean linear expansion coefficient ratio (3)=mean linear expansion coefficient over the (α+40)-(α+60)° C. range/mean linear expansion coefficient over the α-(α+20)° C. range     Equation (1), where α (° C.) is between 50° C. and 400° C. and those cases are excluded where the mean linear expansion coefficient ratio (3) is determined over a range across Tg.

If the mean linear expansion coefficient ratio (3) is within 1.05, a resin material comprised of the resin composition of this invention shows improved dimensional stability and, when laminated with the other material, can avoid occurrence of warpage or separation while in fabrication or in use. It is more preferably within 1.04, further preferably within 1.03.

Preferably, the resin composition of this invention exhibits an improvement factor of up to 0.98. The improvement factor is determined by dividing the mean linear expansion coefficient (α2) over the temperature range from a temperature 10° C. higher than the glass transition temperature of the resin composition to a temperature 50° C. higher than the glass transition temperature of the resin composition by the mean linear expansion coefficient over the temperature range from a temperature 10° C. higher than a glass transition temperature of the resin to a temperature 50° C. higher than the glass transition temperature of the resin. If the improvement factor is within 0.98, the inorganic compound provides sufficient improvements in high-temperature properties to a resin material comprised of the resin composition of this invention. Accordingly, such a resin material shows no trouble while in a fabrication process involving a high-temperature treatment or while in high-temperature use. The improvement factor is more preferably up to 0.90, further preferably up to 0.75.

Because of its low mean linear expansion coefficient over a high temperature range above the glass transition temperature, as described above, the resin composition of this invention exhibits improved high-temperature properties, such as in dimensional stability at high temperatures, and can be used as a resin material which can avoid occurrence of warpage or separation in high-temperature treatment processes, such as a plating process, curing process and a reflowing process of a lead-free solder.

Preferably, the resin composition of this invention exhibits a tensile modulus of at least 10 GPa at 140° C. and a dielectric constant at 1 MHz of up to 4.5. In the case where the resin composition of this invention is used for a TAB tape, if a tensile modulus of the resin composition at 140° C. is below 10 GPa, its thickness in some cases must be increased to insure required strength, possibly resulting in the failure to fabricate a small-sized TAB. If a dielectric constant of the resin composition at 1 MHz exceeds 3.3, its thickness in some cases must be increased to insure sufficient reliability, possibly resulting in the failure to fabricate a small-sized TAB.

Preferably, the resin composition of this invention exhibits a water absorbency of up to 2.0%. If the water absorbency exceeds 2.0%, in the case where the resin composition of this invention is used to fabricate a board, there occurs a change in dimension of the board when oven-dried and when water-loaded. This may result in the difficulty to provide minute wiring or may result in the failure to reduce a size of the board.

Preferably, the resin composition of this invention exhibits a water absorbency of up to 2.0% and a dielectric constant at 1 MHz of up to 4.5 and, after water absorption, exhibits a dielectric constant at 1 MHz of up to 5.0. Water absorption may cause a large change in electrical properties of the resin composition to result in the failure to keep reliability. Also, water absorption may cause bursting of materials during a fabrication process such as solder reflowing to result in the reduction of a yield. The following procedure is utilized to determine the water absorbency. A 50-100 μm thick film is cut to a 3×5 cm strip to provide a test piece. The test piece is dried at 150° C. for 5 hours and its weight $W1$ is measured. The dried test piece is then placed in boiled water at 100° C. for 1 hour and well wiped at its surface. Thereafter, its weight $W2$ is measured. The water absorbency is calculated from the following equation (2):

$$\text{Water absorbency (\%)} = (W2-W1)/W1 \times 100 \qquad (2)$$

Preferably, the resin composition of this invention, when formed into a 25 μm thick resin sheet, exhibits an insulation resistance of at least $10^8 \Omega$. When the resin composition of this invention is used to fabricate a substrate or the like, its thickness must be at least 25 μm in order to insure sufficient insulation performance. If the substrate or the like having a thickness of at least 25 μm has an insulation resistance of at least $10^8 \Omega$, its high insulation reliability can be insured.

The resin composition of this invention preferably exhibits a glass transition temperature of 100° C. or above. If the glass transition temperature of the resin composition of this invention is 100° C. or above, the use thereof for a substrate improves high-temperature physical properties of the substrate, particularly lead-free solder heat resistance and dimensional stability against heat. The glass transition temperature of the resin composition is more preferably 140° C. or above, further preferably 200° C. or above.

Preferably, the resin composition of this invention exhibits a breaking extension at 260° C. of at least 10%. If the breaking extension at 260° C. is at least 10%, in the case where the resin composition of this invention is used for a substrate or the like, it shows a good follow-up action to the other substrate in a solder reflowing process.

The resin composition of this invention exhibits the above-stated excellent high-temperature physical properties and contains a thermosetting resin and an inorganic compound. The thermosetting or photocurable resin refers to a resin which assumes a liquid, semi-solid or solid form at ordinary temperature, has a relatively low molecular weight, shows fluidity under ordinary temperature or when heated, and undergoes a chemical reaction, such as a curing or crosslinking reaction, by the action of a curing agent, catalyst, heat or radiation to increase its molecular weight and finally form a resin having a three-dimensional network structure that can not be remelted or refused.

Examples of thermosetting resins include epoxy resins, thermosetting modified polyphenylene ether resins, thermosetting polyimide resins, silicone resins, benzoxazine resins, melamine resins, urea resins, allyl resins, phenol resins, unsaturated polyester resins, bismaleimide triazine resins, alkyd resins, furan resins, polyurethane resins and aniline resins. Preferred among the above-listed resins are epoxy resins, thermosetting modified polyphenylene ether resins, thermosetting polyimide resins, silicone resins, benzoxazine resins and melamine resins. There thermosetting resins may be used alone or in combination.

The epoxy resin refers to an organic compound having at least one epoxy group. Preferably, the epoxy resin contains one or more epoxy groups per molecule, more preferably two or more epoxy groups permolecule. Here, the number of epoxy groups per molecule is calculated by dividing a total number of epoxy groups present in the epoxy resin by a total number of molecules in the epoxy resin.

Conventionally known epoxy resins are useful as the above epoxy resin. For example, the following epoxy resins (1)-(11) are useful. These epoxy resins may be used alone or in combination.

Examples of epoxy resins (1) include bisphenol resins such as bisphenol A epoxy resins, bisphenol F epoxy resins, bisphenol AD epoxy resins, bisphenol S epoxy resins; novolak epoxy resins such as phenol novolak epoxy resins and cresol novolak epoxy resins; aromatic epoxy resins such as tris-phenolmethane triglycidyl ether; and hydrides and bromides of these resins.

Examples of epoxy resins (2) include alicyclic epoxy resins such as 3,4-epoxycyclohexylmethyl-3,4-epoxycyclohexane carboxylate, 3,4-epoxy-2-methylcyclohexylmethyl-3,4-epoxy-2-methylcyclohexane carboxylate, bis(3,4-epoxycyclo-hexyl)adipate, bis(3,4-epoxycyclohexylmethyl) adipate, bis(3,4-epoxy-6-methylcyclohexylmethyl)adipate, 2-(3,4-epoxycyclohexyl-5,5-spiro-3,4-epoxy)cyclohexanone-meth-dioxaneandbis(2,3-epoxycyclopentyl)ether.

One example of commercially available epoxy resins (2) is "HPE-3150" (softening temperature of 71° C.) manufactured by Daicel Chem. Industries, Ltd.).

Examples of epoxy resins (3) include aliphatic epoxy resins such as diglycidyl ether of 1,4-butanediol, diglycidyl ether of 1,6-hexanediol, triglycidyl ether of glycerin, triglycidyl ether of trimethylolpropane, diglycidyl ether of polyethylene glycol, diglycidyl ether of polypropylene glycol, polyglycidyl ether of long-chain polyol including polyoxyalkylene glycol having 2-9 carbon atoms in the alkylene or polytetramethylene ether glycol.

Examples of epoxy resins (4) include glycidyl ester epoxy resins such as diglycidyl phthalate ester, diglycidyl tetrahydrophthalate ester, diglycidyl hexahydrophthalate ester, diglycidyl-p-oxybenzoic acid, glycidyl ether-glycidyl ester of salicylic acid and glycidyl ester of dimer acid, and hydrides of these resins.

Examples of epoxy resins (5) include glycidyl amine epoxy resins such as triglycidyl isocyanurate, N,N'-diglycidyl derivative of cyclic alkylene urea, N,N,O-triglycidyl derivative of p-aminophenol and N,N,O-triglycidyl derivative of m-aminophenol, and hydrides of these resins.

Examples of epoxy resins (6) include copolymers of glycidyl (meth)acrylate with radically polymerizable monomers such as ethylene, vinyl acetate and (meth)acrylate ester.

Examples of epoxy resins (7) include polymers comprised chiefly of a conjugate diene compound such as epoxidated polybutadiene, and their partial hydride polymers with a double bond of unsaturated carbons being epoxidated.

Examples of epoxy resins (8) include block copolymers containing, in the same molecule, a polymer block comprised chiefly of a vinyl aromatic compound and a polymer block comprised chiefly of a conjugate diene compound or a polymer block of its partial hydride, with a double bond of unsaturated carbons in the conjugate diene compound being epoxidated.

Examples of epoxy resins (9) include polyester resins containing one or more epoxy groups per molecule, preferably two or more epoxy groups per molecule.

Examples of epoxy resins (10) include urethane modified epoxy resins and polycaprolactone modified epoxy resins made by introducing urethane linkages or polycaprolactone linkages into the structures of the preceding epoxy resins (1)-(9).

Examples of epoxy resins (11) include rubber modified epoxy resins made by incorporating a rubber component, such as NBR, CTBN, polybutadiene, acrylic rubber, in the epoxy resins (1)-(10). Besides the epoxy resin, they may also contain a resin having at least one oxirane ring or an oligomer.

The type of the curing agent used to cure the epoxy resin is not particularly specified. Those conventionally known as useful for curing epoxy resins can be used. Examples of such curing agents include amine compounds, polyaminoamide and other compounds synthesized from amine compounds, tertiary amine compounds, imidazole compounds, hydrazide compounds, melamine compounds, acid anhydrides, phenol compounds, thermally latent cationic polymerization catalysts, photolatent cationic polymerization initiators, dicyandiamide and its derivatives. These curing agents may be used alone or in combination.

Examples of amine compounds include, but not limited to, linear aliphatic amines and their derivatives such as ethylenediamine, diethylenetriamine, triethylenetetramine, tetraethylenepentamine, polyoxypropylenediamine and polyoxypropylenetriamine; cyclic aliphatic amines and their derivatives such as menthanediamine, isophoronediamine, bis(4-amino-3-methylcyclohexyl)methane, diaminodicyclo-hexylmethane, bis(aminomethyl)cyclohexane, N-aminoethyl-piperazine and 3,9-bis(3-aminopropyl)2,4,8,10-tetraoxa-spiro(5,5)undecane; aromatic amines and their derivatives such as m-xylenediamine, α-(m/p-aminophenyl)ethylamine, m-phenylenediamine, diaminodiphenylmethane, diaminodiphenylsulfone, α,α-bis(4-aminophenyl)-p-diisopropylbenzene; and the like.

Examples of compounds synthesized from amine compounds include, but not limited to, polyaminoamide compounds synthesized from the above-listed amine compounds and carboxylic acid compounds such as succinic acid, adipic acid, azelaic acid, sebacic acid, dodecanoic acid, isophthalic acid, terephthalic acid, dihydroisophthalic acid, tetrahydroisophthalic acid and hexahydroisophthalic acid, and their derivatives; polyaminoimide compounds synthesized from the above-listed amine compounds and maleimide compounds such as diaminodiphenylmethanebismaleimide, and their derivatives; ketimine compounds synthesized from the above-listed amine compounds and ketone compounds, and their derivatives; polyamino compounds synthesized from the above-listed amine compounds and other compounds such as epoxy compounds, urea, thiourea, aldehyde compounds, phenol compounds and acrylic compounds, and their derivatives; and the like.

Examples of tertiary amine compounds include, but not limited to, N,N-dimethylpiperazine, pyridine, picoline, benzyldimethylamine, 2-(dimethylaminomethyl)phenol, 2,4,6-tris(dimethylaminomethyl)phenol, 1,8-diazobiscyclo(5,4,0)undecene-1 and their derivatives.

Examples of imidazole compounds include, but not limited to, 2-methylimidazole, 2-ethyl-4-methylimidazole, 2-undecylimidazole, 2-heptadecylimidazole, 2-phenylimidazole, and their derivatives.

Examples of hydrazide compounds include, but not limited to, 1,3-bis(hydrazinocarboethyl)-5-isopropylhydantoin, 7,11-octadecadiene-1,18-dicarbohydrazide, eicosanoic diacid dihydrazide, adipic acid dihydrazide and their derivatives.

Examples of melamine compounds include, but not limited to, 2,4-diamino-6-vinyl-1,3,5-triazine and its derivatives.

Examples of acid anhydrides include, but not limited to, phthalic anhydride, trimellitic anhydride, pyromellitic anhydride, benzophenonetetracarboxylic anhydride, ethylene glycol bis(anhydro)trimellitate, glycerol tris(anhydro)trimellitate, methyltetrahydrophthalic anhydride, tetrahydrophthalic anhydride, nadic anhydride, methylnadic anhydride, trialkyltetrahydrophthalic anhydride, hexahydrophthalic anhydride, methylhexahydrophthalic anhydride, 5-(2,5-dioxotetrahydrofuryl)-3-methyl-3-cyclohexene-1,2-dicarboxylic anhydride, trialkyltetrahydrophthalic anhydride-maleic anhydride adduct, dodecenylsuccinic anhydride, polyazelaic polyanhydride, polydodecanoic dianhydride, chlorendic anhydride and their derivatives.

Examples of phenol compounds include, but not limited to, phenol novolak, o-cresol novolak, p-cresol novolak, t-butylphenol novolak, dicyclopentadiene cresol and their derivatives.

Examples of thermally latent cationic polymerization catalysts include, but not limited to, ionic thermally latent cationic polymerization catalysts such as benzylsulfonium salt, benzylammonium salt, benzylpyridinium salt and benzyl-phosphonium salt which are associated with counter anions such as antimony hexafluoride, phosphorus hexafluoride and boron tetrafluoride; nonionic thermally latent cationic polymerization catalysts such as N-benzylphthalimide and aromatic sulfonate ester; and the like.

Examples of photolatent cationic polymerization initiators include, but not limited to, ionic photolatent cationic polymerization initiators such as aromatic diazonium salts, aromatic halonium salts, aromatic sulfonium salts and other onium salts which are associated with counter anions such as antimony hexafluoride, phosphorus hexafluoride and boron tetrafluoride, and organometallic complexes such as iron-allene complex, titanocene complex and arylsilanol-aluminum complex; and nonionic photolatent cationic polymerization initiators such as nitrobenzyl esters, sulfonic acid derivatives, phosphate esters, phenolsulfonate esters, diazonaphthoquinone and N-hydroxyimidesulfonate.

Examples of thermosetting, modified polyphenylene ether resins include resins prepared by modifying the preceding polyphenylene ether resin with thermosetting groups such as glycidyl, isocyanate and amino groups. These thermosetting, modified polyphenylene ether resins may be used alone or in combination.

The thermosetting polyimide resins are resins which have an imide bond in the main molecular chain. Specific examples of thermosetting polyimide resins include condensation polymers of aromatic diamines and aromatic tetracarboxylic acids, bismaleimide resins which are addition polymers of aromatic diamines and bismaleimide, a polyaminobismaleimide resin which is an addition polymer of aminobenzoic acid hydrazide and bismaleimide, and bismaleimide triazine resins derived from dicyanate compounds and bismaleimide resins. The bismaleimide triazine resins, among them, are particularly suitable for use as the thermosetting polyimide resin. These thermosetting polyimide resins may be used alone or in combination.

The preceding silicone resins contain a silicon-silicon, silicon-carbon, siloxane or silicon-nitrogen bond in a molecular chain. Specific examples of silicone resins include polysiloxane, polycarbosilane and polysilazane.

The preceding benzoxazine resins are obtained via ring-opening polymerization of oxazine rings of benzoxazine monomers. Examples of benzoxazine monomers include, but not limited to, those having a functional group, such as phenyl, methyl or cyclohexyl, coupled to a nitrogen in an oxazine ring.

The preceding urea resins are obtained via addition condensation of urea and formaldehyde. The type of the curing agent used to initiate a curing reaction of the urea resins is not particularly specified. Examples of such curing agents include non-latent curing agents comprising acid salts such as inorganic acid, organic acid and acid sodium sulfate; and latent curing agents comprising salts such as carboxylate ester, acid anhydride, ammonium chloride and ammonium phosphate. The latent curing agents, among them, are particularly preferred for their long storage lives and others.

The allyl resins are obtained via a polymerization or curing reaction of diallylphthalate monomers which include ortho-isomers, iso-isomers and tere-isomers, for example. The catalyst useful for such a curing reaction is not particularly specified. The use of t-butyl perbenzoate in combination with di-t-butyl peroxide is preferred.

Preferably, the thermosetting resin has a glass transition temperature of 100° C. or above and a dielectric constant at 1 MHz of up to 4.5. If the thermosetting resin has a glass transition temperature of 100° C. or above and a dielectric constant at 1 MHz of up to 4.5, a resin material comprised of the resin composition of this invention shows improved high-temperature physical properties, particularly in lead-free solder heat resistance and dimensional stability against heat, resulting in obtaining high reliability and a satisfactory signal transmission rate in a high-frequency range, both required for an electronic material. The glass transition temperature of the thermosetting resin is more preferably 140° C. or above, further preferably 200° C. or above. The dielectric constant at 1 MHz of the thermosetting resin is more preferably up to 4.0, further preferably up to 3.6.

Preferably, the thermosetting resin has a solubility parameter (SP value) of 42 $[J/cm^3]^{1/2}$ or above, when calculated using a Fedors equation. The SP value, according to the Fedors equation, is given by a square root of a sum of molar cohesive energies of respective atomic groups and indicates a polarity per unit volume. The thermoplastic resin with a solubility parameter (SP value) of 42 $[J/cm^3]^{1/2}$ or above has a high polarity and thus shows good compatibility with an inorganic compound such as a chemically treated layer silicate. Accordingly, in the case where a layer silicate is used as the inorganic compound, such a thermoplastic resin is able to increase an interlayer spacing of the layer silicate and achieve layer by layer dispersion thereof. The SP value of the thermoplastic resin is more preferably 46.2 $[J/cm^3]^{1/2}$ or above, further preferably 52.5 $[J/cm^3]^{1/2}$ or above.

Examples of resins with SP values of 42 $[J/cm^3]^{1/2}$ and above include epoxy resins, phenol resins, urea resins, unsaturated polyester resins, allyl resins, thermosetting polyimide resins, bismaleimide triazine resins, thermosetting modified polyphenylene ether resins, silicone resins and benzoxazine resins.

The thermosetting resin preferably exhibits a 10% weight loss temperature of at least 400° C. in the thermogravimetric measurement under nitrogen atmosphere. If at least 400° C., the resin composition of this invention provides a resin material which avoids outgassing in high-temperature treating processes such as lead-free solder reflowing, making it suitable for use as an electronic material. The 10% weight loss temperature of the thermosetting resin is more preferably at least 450° C., further preferably at least 500° C. Examples of resins which exhibit a 10% weight loss temperature of at least 400° C. in the thermogravimetric measurement under nitrogen atmosphere include thermosetting polyimide resins, liquid crystal resins, polysulfone resins, polyether sulfone resins, polyoxydiazole resins and polycarbonate resins.

The resin composition of this invention contains an inorganic compound.

Examples of inorganic compounds include layer silicate, talc, silica, alumina and glass beads. For the purpose of improving high-temperature physical properties, the use of a layer silicate, among them, is preferred. In the specification of this application, the layer silicate refers to a layered silicate mineral, either synthetic or natural, which has exchangeable metal cations between layers.

Particularly when high tensile modulus is sought, a combination of layer silicate and whisker, as the inorganic compound, is preferably incorporated in the resin composition. Although incorporation of whisker into resins is known to improve modulus, resin compositions incorporating whisker in the amount sufficient to attain high tensile strength suffer from a problem of poor moldability or extrudability. In the present invention, a combination of whisker and layer silicate is used as the organic compound. Accordingly, sufficient modulus improvement can be achieved by incorporation of a smaller amount of whisker.

Examples of layer silicates include smectite clay minerals such as montmorillonite, hectorite, saponite, beidellite, stevensite and nontronite; swelling mica; vermiculite; and halloysite. Among them, at least one selected from the group consisting of montmorillonite, hectorite, swelling mica and vermiculite is preferably used. These layer silicates may be used alone or in combination.

The crystal shape of the layer silicate used is not particularly specified. Preferably, the layer silicate has a mean length from 0.01 μm to 3 μm, a thickness from 0.001 μm to 1 μm and an aspect ratio from 20 to 500. More preferably, the layer silicate has a mean length from 0.05 μm to 2 μm, a thickness from 0.01 μm to 0.5 μm and an aspect ratio from 50 to 200.

The layer silicate preferably shows a large value for the shape anisotropy effect defined by the following equation (3). With the use of layer silicate having a large shape anisotropy effect, the resin composition of this invention can provide resins which exhibit excellent mechanical properties.

Shape anisotropy effect=area of a surface of a flaky crystal that extends along a plane of lamination/area of a surface of the flaky crystal that extends across the plane of lamination     Equation (3)

The exchangeable metal cations present between layers of the layer silicate refers to metal ions, such as sodium and calcium ions, which exist on surfaces of flaky crystals of the layer silicate. These metal ions are cation exchangeable with cationic materials so that they can insert (intercalate) various cationic materials between crystal layers of the layer silicate.

The cation exchange capacity of the layer silicate is not particularly specified. However, it may preferably be from 50 milliequivalents/100 g to 200 milliequivalents/100 g. If the cation exchange capacity is below 50 milliequivalents/100 g, the amount of cationic materials intercalated, through cation exchange, between crystal layers of the layer silicate may be reduced to result in the occasional failure to fully nonpolarize (hydrophobicize) the space between crystal layers. If the cation exchange capacity exceeds 200 milliequivalents/100 g, a bonding force of adjacent crystal layers of the layer silicate may become excessively strong to result in the difficulty for crystal layers to separate from each other.

In the preparation of the resin composition of this invention, the layer silicate for use as the inorganic compound is preferably chemically modified to increase its affinity for the resin so that its dispersion in the resin is improved. Such chemical modification allows the layer silicate to disperse in a large quantity in the resin. Without chemical modification as appropriate to the resin for use in this invention or to a solvent for use in the preparation of the resin composition of this invention, the layer silicate has a tendency to agglomerate to result in the failure to disperse in a large quantity in the resin. However, chemical modification as appropriate to the resin or to the solvent allows the layer silicate, even when incorporated in the amount of 10 parts by weight or more, to readily disperse in the resin without agglomeration. Chemical modification can be achieved, for example, by the following methods (1)-(6). These chemical modification methods may be employed alone or in combination.

The chemical modification method (1) is also referred to as a cation exchange method using a cationic surfactant. Specifically, the layer silicate is cation exchanged at its interlayer spaces with a cationic surfactant so that they are hydrophobicized, before the resin composition of this invention is obtained using a low-polarity resin. The previous hydrophobicization of interlayer spaces of the layer silicate increases an affinity between the layer silicate and the low-polarity resin, so that the layer silicate can be more uniformly and finely dispersed in the low-polarity resin.

The cationic surfactant is not particularly specified. Examples of cationic surfactants include quaternary ammonium salts and quaternary phosphonium salts. The use of alkyl ammonium ions containing 6 or more carbon atoms, aromatic quaternary ammonium ions and heterocyclic quaternary ammonium ions is preferred for their ability to fully hydrophobicize spaces between crystal layers of the layer silicate.

The quaternary ammonium salt is not particularly specified in type. Examples of quaternary ammonium salts include trimethylalkyl ammonium salts, triethylalkyl ammonium salts, tributylalkyl ammonium salts, dimethyldialkyl ammonium salts, dibutyldialkyl ammonium salts, methylbenzyldialkyl ammonium salts, dibenzyldialkyl ammonium salts, trialkyl-methyl ammonium salts, trialkylethyl ammonium salts and trialkylbutylbutyl ammonium salts; aromatic quaternary ammonium salts such as benzylmethyl {2-[2-(p-1,1,3,3-tetramethylbutylphenooxy)ethoxy]ethyl}ammonium chloride; aromatic amine-derived quaternary ammonium salts such as a trimethylphenyl ammonium salt; heterocyclic quaternary ammonium salts such as alkyl pyridinium salts and imidazolium salts; dialkyl quaternary ammonium salts having two polyethylene glycol chains, dialkyl quaternary ammonium salts having two polypropylene glycol chains, trialkyl quaternary ammonium salts having a polyethylene glycol chain and trialkyl quaternary ammonium salts having a polypropylene glycol chain. Preferred among them are a lauryltrimethyl ammonium salt, stearyltrimethyl ammonium salt, trioctylmethyl ammonium salt, distearyldimethyl ammonium salt, di-hardened tallow-dimethyl ammonium salt, distearyl-dibenzyl ammonium salt and N-polyoxyethylene-N-lauryl-N,N'-dimethyl ammonium salt. These quaternary ammonium salts may be used alone or in combination.

The quaternary phosphonium salt is not particularly specified in type. Examples of quaternary phosphonium salts include a dodecyltriphenyl phosphonium salt, methyltriphenyl phosphonium salt, lauryltrimethyl phosphonium salt, stearyl trimethyl phosphonium salt, trioctylmethyl phosphonium salt, distearyldimethyl phosphonium salt and distearyldibenzyl phosphonium salt. These quaternary phosphonium salts may be used alone or in combination.

The chemical modification method (2) utilizes a compound having, at its molecular terminal, at least one functional group either chemically linkable to a hydroxyl group or having a high chemical affinity for a hydroxyl group to chemically treat hydroxyl groups present on crystal surfaces of the organically modified layer silicate which has been chemically treated by the chemical modification method (1).

The functional group either chemically linkable to a hydroxyl group or having a high chemical affinity for a hydroxyl group is not particularly specified and can be illustrated by alkoxy, glycidyl, carboxyl (including dibasic anhydride), hydroxyl, isocyanate and aldehyde.

The compound having a functional group chemically linkable to a hydroxyl group or the compound having a functional group having a high chemical affinity for a hydroxyl group is not particularly specified and can be illustrated by a silane compound, a titanate compounds, a glycidyl compound, various carboxylic acids and alcohols, which respectively have any of the preceding functional groups. These compounds may be used alone or in combination.

The silane compound is not particularly specified. Examples of silane compounds include vinyltrimethoxysilane, vinyltriethoxysilane, vinyltris(β-methoxyethoxy)silane, γ-aminopropyltrimethoxysilane, γ-aminopropylmethyldimethoxy-silane, γ-aminopropyldimethylmethoxysilane, γ-aminopropyl-triethoxysilane, γ-aminopropyldiethoxysilane, γ-amino-propyldimethylethoxysilane, methyltriethoxysilane, dimethyl-dimethoxysilane, trimethylmethoxysilane, hexyltrimethoxy-silane, hexyltriethoxysilane, N-β-(aminoethyl) γ-amino-propyltrimethoxysilane, N-β-(aminoethyl) γ-aminopropyl-triethoxysilane, N-β-(aminoethyl) γ-aminopropylmethyl-dimethoxysilane, octadecyltrimethoxysilane, octadecyl-triethoxysilane, γ-methacryloxypropylmethyldimethoxysilane, γ-methacryloxypropylmethyldiethoxysilane, γ-methacryloxy-propyltrimethoxysilane and γ-methacryloxypropyltriethoxy-sialne. These silane compounds may be used alone or in combination.

The chemical modification method (3) utilizes a compound having, at its molecular terminal, a functional group either chemically linkable to a hydroxyl group or having a high chemical affinity for a hydroxyl group and at least one reactive functional group to chemically treat hydroxyl groups present on crystal surfaces of the layer silicate which has been organically modified by the chemical modification method (1).

The chemical modification method (4) utilizes a compound having an anionic surface activity to chemically treat hydroxyl groups present on crystal surfaces of the layer silicate which has been organically modified by the chemical modification method (1).

The compound having an anionic surface activity is not particularly specified in type, so long as it can chemically treat the layer silicate by ionic interaction. Examples of such compounds include sodium laurate, sodium stearate, sodium oleate, sulfate ester salts of higher alcohols, sulfate ester salts of secondaryhigher alcohols and sulfate ester salts of unsaturated alcohols. These compounds maybe used alone or in combination.

The chemical modification method (5) utilizes any of the aforementioned compounds having an anionic surface activity that contains at least one reactive functional group at a site other than the anionic site in the molecular chain to achieve the chemical treatment.

The chemical modification method (6) further utilizes a resin having a functional group reactive with a layer silicate, e.g., a maleic anhydride modified polyphenylene ether resin, besides any of the organically modified layer silicates which have been chemically treated by the chemical modification methods (1)-(5), respectively.

Preferably, the layer silicate is dispersed in the resin composition of this invention such that it has a mean interlayer spacing of at least 3 nm along the (001) plane, when measured by an X-ray diffraction method, and a part or all of stacks consists of 5 or less layers. If the layer silicate is dispersed such that it has a mean interlayer spacing of at least 3 nm and a part or all of stacks consists of 5 or less layers, an interfacial area between the resin and the layer silicate is rendered sufficiently large. Also, a distance between flaky crystals of the layer silicate is rendered to fall within a proper range. As a result, the improving effects by dispersion can be fully obtained such as in high-temperature physical properties, mechanical properties, heat resistance and dimensional stability.

Preferably, the mean interlayer spacing does not exceed 5 nm. If it exceeds 5 nm, the layer-by-layer separation of crystalline flakes of the layer silicate may occur to weaken their interaction to the negligible extent. Then, the binding strength is weakened to occasionally result in the failure to obtain sufficient dimensional stability.

In this specification, the mean interlayer spacing of the layer silicate refers to a mean value of distances between adjacent layers when flaky crystals of the layer silicate are regarded as individual layers, and can be calculated from X-ray diffraction peaks and photographs taken using a transmission electron microscope, i.e., by a wide-angle X-ray diffraction measurement method.

By "the layer silicate is dispersed such that a part or all of stacks consists of 5 or less layers", it is specifically meant that a part or all of stacks of flaky crystals is dispersed due to the weakened interaction between adjacent flaky crystals of the layer silicate. Preferably, at least 10% of stacks of layer silicate is dispersed in the form a stack consisting of 5 or less layers. More preferably, at least 20% of stacks of layer silicate is dispersed in the form of a stack consisting of 5 or less layers.

A proportion of layer silicate that is dispersed in the form of a stack consisting of 5 or less layers can be determined by observing the resin composition by a transmission electron microscope at a magnification of 50,000-100,000, measuring a total number X of layers of layer silicate observable in a particular area and a number Y of layers of layer silicate dispersed in the form of a stack consisting of 5 or less layers, and calculating from the following equation (4):

Proportion (%) of layer silicate that is dispersed in the form of a stack consisting of 5 or less layers=(Y/X)×100   Equation (4)

In order to obtain the effect of dispersion, the layer silicate preferably exists in the form of a stack consisting of 5 or less layers, more preferably 3 or less layers, further preferably in the form of a single layer.

The resin composition of this invention uses a layer silicate as the inorganic compound. The layer silicate is dispersed such that it has a mean interlayer spacing of at least 3 nm along the (001) plane, when measured by an X-ray diffraction method, and a part or all of stacks consists of 5 or less layers. By satisfying these conditions, an interfacial area between the resin and the layer silicate is rendered sufficiently large to increase interactions between the resin and surfaces of the layer silicate. The resulting increase in melt viscosity improves thermal processability such as by heat pressing and makes it easy to retain embossed and other shaped patterns. Also, mechanical properties, e.g., elastic modulus over a wide temperature range from ordinary temperature to high temperature, are improved and can thus be retained even at high temperatures above Tg or a melting point of the resin. As a result, the linear expansion coefficient of the resin composition at high temperatures can be maintained at lower values. Although what brings these results is not clear, it is believed that finely dispersed layer silicate serves in its way as pseudo crosslink points to achieve improvements of such physical properties.

Also, the distance between adjacent flaky crystals of layer silicate is rendered to fall within a proper range, so that those flaky crystals of layer silicate, when combusted, become more likely to move and form a sintered body which constitutes a flame-retardant coating. This sintered body is formed at an early stage of combustion and can thus block oxygen supply from outside and any combustible gas generated by combustion. Therefore, the resin composition of this invention exhibits excellent flame-retardant properties.

Furthermore, in the resin composition of this invention, the layer silicate is finely dispersed on a nanometer scale. Accordingly, in the case where a substrate or the like comprised of the resin composition of this invention is laser drilled such as by a carbon dioxide gas laser, resin components and layer silicate components are decomposed or vaporized simultaneously. Even partially-left drillings of the layer silicate only have sizes of up to several μm and can be readily removed by desmear processing. This reduces the tendency of drillings to cause occurrence of defective plating or the like.

The method used to disperse the layer silicate in the resin composition is not particularly specified. Examples of dispersing methods include a method utilizing an organically modified layer silicate; a method which comprises, in sequence, mixing the resin and layer silicate by a conventional technique and expanding the resin using a blowing agent; and a method using a dispersant. By using these dispersing methods, the layer silicate can be dispersed more uniformly and finely in the resin composition.

The preceding method comprising, in sequence, mixing the resin and layer silicate by a conventional technique and expanding the resin using a blowing agent is a method which utilizes an energy evolved during expansion to disperse the layer silicate. The blowing agent is not particularly specified in type. Examples of blowing agents include gaseous blowing agents, volatile liquid blowing agents, heat-decomposable solid blowing agents and the like. These blowing agents may be used alone or in combination.

The method comprising, in sequence, mixing the resin and layer silicate by a conventional technique and expanding the resin using a blowing agent is not particularly specified. Examples of such methods include a method in which a gaseous blowing agent is impregnated under higher pressure into a resin composition comprising the resin and layer silicate and then vaporized therein to form a resin foam; a method in which a heat decomposable blowing agent is loaded in spaces between adjacent layers of the layer silicate and then decomposed by application of heat to form a resin foam; and the like.

The inorganic compound is incorporated in the amount from 0.1 parts by weight to 65 parts by weight, based on 100 parts by weight of the thermosetting resin. If its loading is below 0.1 parts by weight, the high-temperature properties or moisture absorbency improving effect is lowered. If its loading exceeds 65 parts by weight, the resin composition of this invention becomes high in density (specific gravity) and low in mechanical strength, making it unsuitable for practical use. Preferably, the inorganic compound is loaded in the amount from 1 part by weight to 45 parts by weight. If the loading is below 1 part by weight, the sufficient improving effect on high-temperature properties may not be obtained when the resin composition of this invention is thin processed. If the loading exceeds 45 parts by weight, the moldability or extrudability may be lowered. More preferably, the inorganic compound is loaded in the amount from 5 parts by weight to 30 parts by weight. Within the range of 5-30 parts by weight, no regions exist which provide problems regarding mechanical properties and process suitability, resulting in obtaining sufficient flame retardance.

In the case where a layer silicate is used as the inorganic compound among the resin composition of this invention, the layer silicate is preferably incorporated therein in the amount from 1 part by weight to 50 parts by weight. If its loading is below 1 part by weight, the high-temperature properties or moisture absorbency improving effect may be lowered. If its loading exceeds 50 parts by weight, the resin composition of this invention becomes higher in density (specific gravity) and lower in mechanical strength, possibly making it unsuitable for practical use. Preferably, the layer silicate is incorporated in the amount from 5 parts by weight to 45 parts by weight. If its loading is below 5 parts by weight, the sufficient high-temperature properties improving effect may not be obtained when the resin composition of this invention is thin processed. If its loading exceeds 45 parts by weight, the dispersibility of the layer silicate may be lowered. More preferably, the layer silicate is incorporated in the amount from 8 parts by weight to 40 parts by weight. Within the range of 8-40 parts by weight, no regions exist which provide problems regarding process suitability, resulting in obtaining sufficiently low water absorbency. Also, the effect of reducing the mean linear expansion coefficient is obtained sufficiently in both regions $\alpha 1$ and $\alpha 2$.

Preferably, the resin composition of this invention further contains a halogen-free flame retardant. It is however understood that this is not intended to exclude the case where a slight amount of halogen is mixed in the flame retardant for certain reasons during its manufacturing process.

The flame retardant is not particularly specified in type. Examples of flame retardants include metallic hydroxides such as aluminum hydroxide, magnesium hydroxide, dorsonite, calcium aluminate, dihydrate gypsum and calcium hydroxide; metallic oxides; phosphorus compounds such as red phosphorus and ammonium polyphosphate; nitrogen compounds such as melamine, melamine cyanurate, melamine isocyanurate, melamine phosphate and melamine derivatives prepared by subjecting them to a surface treatment; fluoro resins; silicone oil; layered polyhydrates such as hydrotalsite; silicone-acryl composite rubber; and the like. Among them, metallic hydroxides and melamine derivatives are preferred. Particularly preferred among metallic hydroxides are magnesium hydroxide and aluminum hydroxide which may be treated at their surfaces by various surface treatment agents. Examples of surface treatment agents include, but not limited to, silane coupling agents, titanate coupling agents and PVA surface treatment agents. These flame retardants may be used alone or in combination.

The metallic hydroxide, if used as the flame retardant, is preferably incorporated in the amount from 0.1 parts by weight to 100 parts by weight, based on 100 parts by weight of the thermosetting resin. If its loading is below 0.1 parts by weight, a sufficient flame retarding effect may not be obtained. If its loading exceeds 100 parts by weight, the resin composition of this invention becomes excessively high in density (specific gravity), possibly making it unsuitable for practical use. In some cases, a marked reduction in flexibility or extensibility thereof may result. More preferably, the metallic hydroxide is incorporated in the amount from 5 parts by weight to 80 parts by weight. If its loading is below 5 parts by weight, a sufficient flame retarding effect may not be obtained when the resin composition of this invention is thin processed. On the other hand, if its loading exceeds 80 parts by weight, blistering or the like may occur in high-temperature treatment processes to increase a percent defective. Further preferably, the metallic hydroxide is incorporated in the amount from 10 parts by weight to 70 parts by weight. If its loading is within the range of 10-70 parts by weight, no regions exist where problems arise regarding mechanical properties, electrical properties, process suitability or the like, and the resin composition exhibits sufficient flame retardance.

The melamine derivative, if used as the flame retardant, is preferably incorporated in the amount from 0.1 parts by weight to 100 parts by weight, based on 100 parts by weight of the thermosetting resin. If its loading is below 0.1 parts by weight, a sufficient flame retarding effect may not be obtained. If its loading exceeds 100 parts by weight, a marked reduction in flexibility, extensibility or other mechanical properties of the resin composition may result. More preferably, the melamine derivative is incorporated in the amount from 5 parts by weight to 70 parts by weight. If its loading is below 5 parts by weight, a sufficient flame retarding effect may not be obtained when an insulating substrate is rendered thin. On the other hand, if its loading exceeds 70 parts by weight, a marked reduction in flexibility, extensibility or other mechanical properties of the resin composition may result. Further preferably, the melamine derivative is incorporated in the amount from 10 parts by weight to 50 parts by weight. If its loading is within the range of 10-50 parts by weight, no regions exist where problems arise regarding mechanical properties, electrical properties, process suitability or the like, and the resin composition exhibits sufficient flame retardance.

When needed to modify its properties, various additives may be incorporated in the resin composition of this invention within the range that does not impede achievement of objects of this invention. Examples of such additives include thermoplastic elastomers, crosslinked rubbers, oligomers, nucleating agents, antioxidants (age resisters), thermal stabilizers, light stabilizers, ultraviolet absorbers, lubricants, auxiliary flame retardants, antistatic agents, antifogging agents, fillers, softeners, plasticizers, coloring agents and the like. These additives may be used alone or in combination.

The types of useful thermoplastic elastomers are not particularly limited. Examples of thermoplastic elastomers include styrenic elastomers, olefinic elastomers, urethane elastomers and polyester elastomers. These elastomers may be functionally modified to increase their compatibility with the resin used. These elastomers may be used alone or in combination.

Useful crosslinked rubbers are not particularly limited in type. Examples of crosslinked rubbers include isoprene rubber, butadiene rubber, 1,2-polybutadiene, styrene-butadiene rubber, nitrile rubber, butyl rubber, ethylene-propylene rubber, silicone rubber and urethane rubber. These crosslinked rubbers may preferably be functionally modified to increase their compatibility with the resin used. Such functionally-modified, crosslinked rubbers are not limited in type and can be illustrated by epoxy modified butadiene rubbers and epoxy modified nitrile rubbers. These crosslinked rubbers may be used alone or in combination.

Useful oligomers are not particularly limited in type and can be illustrated by maleic anhydride modified polyethylene oligomers. These oligomers may be used alone or in combination.

Various methods can be utilized to manufacture the resin composition of this invention. Examples of useful methods include a direct kneading method wherein a formulation of the resin, inorganic compound and one or more optional additives is directly blended and kneaded under normal temperature or under heat conditions, and a method which involves mixing those ingredients in a solvent and subsequently removing the solvent; a masterbatch method wherein a masterbatch is first prepared by incorporating a prescribed or greater amount of the inorganic compound in the resin or other resin and kneading them, and this masterbatch in a prescribed amount, the resin in the amount that makes up the deficiency and one or more optional additives in their prescribed amounts are kneaded or mixed in a solvent under normal temperature or under heat conditions.

In the masterbatch method, the masterbatch prepared by incorporating the inorganic compound in the resin or other resin may have the same or different composition as a masterbatch diluting resin composition which contains the resin and is used to dilute the masterbatch and bring the inorganic compound to a desired concentration.

The masterbatch is not particularly specified, but may preferably contain at least one resin selected from the group consisting of a polyamide resin, a polyphenylene ether resin, a polyether sulfone resin and a polyester resin, which resin readily disperses the inorganic compound. The masterbatch diluting resin composition is not particularly specified, but may preferably contain at least one resin selected from the group consisting of a thermosetting polyimide resin and an epoxy resin which exhibit excellent high-temperature physical properties.

The loading of the inorganic compound in the masterbatch is not particularly specified, but may preferably be in the range from 1 part by weight to 500 parts by weight, based on 100 parts by weight of the resin. If the loading is below 1 part by weight, the advantage of the masterbatch which can be diluted to a desired concentration may diminish. If the loading exceeds 500 parts by weight, dispersibility of the masterbatch itself, particularly of the inorganic compound when diluted by the masterbatch diluting resin composition to a predetermined loading, may be lowered. Preferably, the inorganic compound is loaded in the masterbatch in the amount from 5 parts by weight to 300 parts by weight.

Also, a method can be utilized which employs an inorganic compound containing a polymerization catalyst (polymerization initiator) such as transition metal complexes. By kneading a thermoplastic resin monomer and the inorganic compound and then polymerizing the monomer, the resin composition is manufactured simultaneously with polymerization of the thermoplastic resin.

In the preceding methods for manufacture of the resin composition of this invention, the mixture can be kneaded by such techniques as using various kneaders, including an extruder, a two-roll mill and a Banbury mixer.

In the resin composition of this invention, the resin is combined with the inorganic compound so that a Tg and a heat distortion resistance temperature of the resin composition are increased due to the restraint of molecular chains. As a result, the resin composition of this invention has a low coefficient of linear expansion and exhibits improved heat resistance, transparency and physical properties.

Because gaseous molecules have a much higher likelihood of diffusing in the resin, relative to the inorganic compound, and they diffuse therein while moving around the inorganic compound, the resin composition also exhibits improved gas barrier properties. Likewise, the resin composition shows improved gas barrier properties against substances other than such gaseous molecules and exhibits improved solvent resistance, moisture absorbency and water absorbency. This prevents migration of copper from a copper circuit in a multilayer printed wiring board, for example. Also, the occurrence of bleedout of a small amount of additives and following defective plating can be prevented.

The use of the layer silicate as the inorganic compound, even if not incorporated in a large amount, results in obtaining improved physical properties. The resin composition can thus be used to form a thin insulating substrate. This enables manufacture of high-density and thin multilayer printed wiring boards. Also, the nucleating effect of the layer silicate during crystal formation, as well as the swell-restraining effect attributed to the improved moisture resistance, provide an improvement in dimensional stability of the resin composition. Also, because the layer silicate when combusted forms a sintered body, the shape of combusted residues is retained and remains unchanged even after combustion, there by preventing flame spread. Therefore, the resin composition exhibits improved flame retardance.

Also, the use of a non-halogen flame retardant increases physical properties as well as flame retardance of the resin composition of this invention, while giving consideration to the environment.

The resin composition of this invention has various uses. For example, it may be processed, e.g., dissolved into a solvent or formed into a film, into various forms suitable for use as a substrate material which forms a core or buildup layer of a multilayer substrate, sheet, laminate board, resin-bearing copper foil, copper-cladlaminate, TAB tape, printed wiring board, prepreg, varnish and the like. These substrate material, sheet, laminate board, resin-bearing copper foil, copper-clad laminate, TAB tape, printed wiring board, prepreg and adhesive tape also fall within the range of this invention.

The processing method is not particularly specified. Examples of processing methods include an extrusion method wherein the resin composition is melt kneaded by an extruder and then formed into a film as by a T-die or a circular die; a casting method wherein the resin composition is dissolved or dispersed in an organic or other solvent and then cast into a film; a dipping method wherein the resin composition is dissolved or dispersed in an organic or other solvent to provide a varnish into which a cloth-like or nonwoven-like base of an inorganic material, such as glass, or an organic polymer is subsequently dipped to form a film; and the like. Among them, the extrusion method is more suitable for provision of a thin multilayer board. The base used in the dipping method is not particularly specified and may comprise a glass cloth, aramid fibers, polyparaphenylene benzoxazole fibers or the like, for example.

Since the substrate material, sheet, laminate board, resin-bearing copper foil, copper-clad laminate, TAB tape, printed wiring board, prepreg, adhesive tape and optical circuit forming material of this invention comprise the resin composition of this invention, they all exhibit improved high-temperature properties, dimensional stability, solvent resistance, moisture resistance and barrier properties, and can be obtained at high yields even when they are manufactured via multiple processes.

Also, the substrate material of this invention includes a layer silicate finely dispersed in the thermosetting resin on a nanometer scale and thus has a low coefficient of linear expansion, high heat-resisting properties and low water absorbency, as well as having high transparency. Hence, the substrate material of this invention can be suitably used as an optical circuit forming material such as an optical package forming material, an optical waveguide material, a connector material or a sealing material, or an optical communication material.

The resin composition of this invention includes a layer silicate finely dispersed in the thermosetting resin on a nanometer scale and thus has a low coefficient of linear expansion, high heat-resisting properties and low water absorbency, as well as having high transparency. Hence, the resin composition of this invention can be suitably used as an optical circuit forming material such as an optical package forming material, an optical waveguide material, a connector material or a sealing material.

BEST MODE FOR CARRYING OUT THE INVENTION

The present invention is below described in detail by way of non-limiting examples.

Example 1

54 parts by weight of a bisphenol F epoxy resin (product of Dainippon Ink & chemicals, Inc., EPICLON 830LVP), 14.7 parts by weight of BT resin (product of Mitsubishi Gas Chemical Company, Inc.) and 14.7 parts by weight of neopentyl glycol diglycidylether were mixed to provide 83.4 parts by weight of an epoxy resin composition to which 1.9 parts by weight of γ-glycidoxypropyl trimethoxysilane (product of Nippon Unicar Co., Ltd.) as a coupling agent, 1.0 part by weight of acetylacetone iron (product of Nihon Kagaku Sangyo Co., Ltd.) as a curing catalyst, 13.7 parts by weight of swelling fluorine mica (product of CO-OP Chemical Co., Ltd., SOMASIF MAE-100) organically modified with a distearyldimethyl quaternary ammonium salt, as a layer silicate, and 200 parts by weight of methyl ethyl ketone (product of Wako Pure Chemicals Industries, Ltd., guaranteed grade) as an organic solvent were subsequently added. The resulting mixture was stirred by a stirring machine for 1 hour, further mixed by a planetary stirring machine and then deaerated to obtain a resin/layer silicate salt solution. The obtained resin/layer silicate salt solution while placed in a mold was desolvated, heated at 110° C. for 3.5 hours, further heated at 160° C. for 3 hours so that it was caused to cure. As a result, 2 mm and 100 µm thick plates of the resin composition were fabricated.

Example 2

80 parts by weight of an epoxy resin composition containing 40 parts by weight of a bisphenol A epoxy resin (product of Dow Chemical Japan Ltd., D.E.R 331L) and 40 parts by weight of a solid epoxy resin (product of Tohto Kasei Co., Ltd., YP 55), 2.8 parts by weight of dicyanazide (product of Adeka Co., Ltd., ADEKA HARDENER EH-3636), 1.2 parts by weight of modified imidazole (product of Adeka Co., Ltd., ADEKA HARDENER EH-3366), 16 parts by weight of synthetic hectorite (product of CO—OP Chemical Co., Ltd., LUCENTITE STN) chemically treated with a trioctylmethylammonium salt, as a layer silicate, and 400 parts by weight of dimethyl formamide (product of Wako Pure Chemicals Industries, Ltd., guaranteed grade) as an organic solvent were charged into a beaker, stirred by a stirring machine for 1 hour and then deaerated to obtain a resin/layer silicate salt solution. The obtained resin/layer silicate salt solution was coated onto a sheet of polyethylene terephthalate, desolvated, heated at 110° C. for 3 hours, further heated at 170° C. for 30 minutes so that it was caused to cure. As a result, 2 mm and 100 µm thick plates of the resin composition were fabricated.

Example 3

80 parts by weight of an epoxy resin composition containing 56 parts by weight of a bisphenol A epoxy resin (product of Dow Chemical Japan Ltd., D.E.R 331L) and 24 parts by weight of a solid epoxy resin (product of Tohto Kasei Co., Ltd., YP 55), 3.9 parts by weight of dicyanazide (product of Adeka Co., Ltd., ADEKA HARDENER EH-3636), 1.7 parts by weight of modified imidazole (product of Adeka Co., Ltd., ADEKA HARDENER EH-3366), 30 parts by weight of synthetic hectorite (product of CO—OP Chemical Co., Ltd., LUCENTITE STN) chemically treated with a trioctylmethylammonium salt, as a layer silicate, 250 parts by weight of dimethyl formamide (product of Wako Pure Chemicals Industries, Ltd., guaranteed grade) as an organic solvent, and 22 parts by weight of synthetic silica (product of Admatechs Co., Ltd., ADMAFINE SO-E2) were charged into a beaker, stirred by a stirring machine for 1 hour and then deaerated to obtain a resin/layer silicate salt solution. The obtained resin/layer silicate salt solution was coated onto a sheet of polyethylene terephthalate, desolvated, heated at 110° C. for 3 hours, further heated at 170° C. for 30 minutes so that it was caused to cure. As a result, 2 mm and 100 µm thick plates of the resin composition were fabricated.

Example 4

80 parts by weight of an epoxy resin composition containing 56 parts by weight of a bisphenol A epoxy resin (product of Dow Chemical Japan Ltd., D.E.R 331L) and 24 parts by weight of a solid epoxy resin (product of Tohto Kasei Co., Ltd., YP 55), 1.7 parts by weight of dicyanazide (product of Adeka Co., Ltd., ADEKA HARDENER EH-3636), 0.7 parts by weight of modified imidazole (product of Adeka Co., Ltd., ADEKA HARDENER EH-3366), 16 parts by weight of synthetic hectorite (product of CO—OP Chemical Co., Ltd., LUCENTITE STN) chemically treated with a trioctylmethylammonium salt, as a layer silicate, 10 parts by weight of aluminum borate whisker (product of Shikoku Chemicals Corp., ALBOREX YS 3A), 22 parts by weight of magnesium hydroxide (product of Kyowa Chemical Industry Co., Ltd., KISUMA 5J), and 250 parts by weight of dimethyl formamide (product of Wako Pure Chemicals Industries, Ltd., guaranteed grade) as an organic solvent were charged into a beaker, stirred by a stirring machine for 1 hour and deaerated to obtain a resin/layer silicate salt solution. The obtained resin/layer silicate salt solution was coated onto a sheet of polyethylene terephthalate, desolvated, heated at 110° C. for 3 hours, further heated at 170° C. for 30 minutes so that it was caused to cure. As a result, 2 mm and 100 µm thick plates of the resin composition were fabricated.

Comparative Example 1

The procedure of Example 1 was followed, except that the swelling fluorine mica (product of CO-OP Chemical Co., Ltd., SOMASIF MAE-100) was excluded, to prepare a resin composition and fabricate 2 mm and 100 μm thick plates of the resin composition.

Comparative Example 2

The procedure of Example 2 was followed, except that the synthetic hectorite (product of CO-OP Chemical Co., Ltd., LUCENTITE STN) was excluded, to prepare a resin composition and fabricate 2 mm and 100 μm thick plates of the resin composition.

Comparative Example 3

The procedure of Example 3 was followed, except that the synthetic hectorite (product of CO-OP Chemical Co., Ltd., LUCENTITE STN) was excluded and the loading of the synthetic silica was changed to 52 parts by weight, to prepare a resin composition and fabricate 2 mm and 100 μm thick plates of the resin composition.

Comparative Example 4

The procedure of Example 4 was followed, except that the synthetic hectorite (product of CO-OP Chemical Co., Ltd., LUCENTITE STN) was excluded and the loading of magnesium hydroxide was changed to 42 parts by weight, to prepare a resin composition and fabricate 2 mm and 100 μm thick plates of the resin composition.

(Evaluation)

The plates prepared in Examples 1-4 and Comparative Examples 1-4 were evaluated for below-itemized performance. The results are given in Tables 1 and 2.

(1) Measurement of Thermal Expansion Coefficient

Each plate was cut into a 3 mm×25 mm size to provide a test piece. The test piece was heated at a rate of 5° C./min using a TMA (thermomechanical analysis) instrument (product of Seiko Instruments, Inc., TMA/SS120C), measured for mean linear expansion coefficient and evaluated for the following itemized performance:

Mean linear expansion coefficient ($\alpha 2$) [° C.$^{-1}$] over a temperature range 10° C.-50° C. higher than a glass transition temperature of the resin composition;

Mean linear expansion coefficient ratio ($\alpha 2/\alpha 1$) determined by dividing the mean linear expansion coefficient ($\alpha 2$) over the temperature range 10° C.-50° C. higher than the glass transition temperature of the resin composition by a mean linear expansion coefficient ($\alpha 1$) at a temperature range 10° C.-50° C. lower than the glass transition temperature of the resin composition;

Mean linear expansion coefficient [° C.$^{-1}$] over the 50° C.-100° C. temperature range and mean linear expansion coefficient [° C.$^{-1}$] over the 200° C.-240° C. temperature range;

Mean linear expansion coefficient ratio (1) determined by dividing the mean linear expansion coefficient over the 50° C.-100° C. temperature range by the mean linear expansion coefficient over the 200° C.-240° C. temperature range, as well as mean linear expansion coefficient ratio (2) determined by dividing the mean linear expansion coefficient over the 250° C.-300° C. temperature range by the mean linear expansion coefficient over the 50° C.-100° C. temperature range;

Change rate (%) determined by dividing a change in length of each plate when increased in temperature from 25° C. to 300° C. by a length of the plate at 25° C.;

Mean linear expansion coefficient ratio (3) represented by the preceding equation (1); and Improvement factor determined by dividing a mean linear expansion coefficient over the temperature 10° C.-50° C. higher than a Tg of the resin composition of each Example by a mean linear expansion coefficient over the temperature 10° C.-50° C. higher than a Tg of the resin composition prepared in the corresponding Comparative Example, i.e., Comparative Example 1, 2, 3, 4 or 5.

(2) Mean Interlayer Spacing of Layer Silicate

For each 2 mm thick plate, 2θ at diffraction peaks was measured from diffraction of an X-ray on a surface of a layer silicate salt that extended along a plane of lamination, using an X-ray diffraction measurement instrument (product of Rigaku Industrial Corp., RINT 1100). The separation d of the (001) planes of the layer silicate was calculated from the following Bragg's diffraction equation (5). The obtained value for d was taken as a mean interlayer spacing (nm).

$$\lambda = 2d \sin \theta \quad (5)$$

In the equation (5), λ is 0.154 and θ represents a diffraction angle.

(3) Proportion of a Layer Silicate that is Dispersed in the Form of a Stack Consisting of 5 or Less Layers Each 100 μm thick plate was observed by a transmission electron microscope at a magnification of 100,000 to measure a total number X of layers of the layer silicate observable in a particular area, as well as a number Y of layers of the layer silicate dispersed in the form of a stack consisting of 5 or less layers. The proportion of the layer silicate that was dispersed in the form of a stack consisting of 5 or less layers was calculated from the following equation (4):

Proportion (%) of layer silicate that is dispersed in the form of a stack consisting of 5 or less layers=(Y/X)×100     Equation (4)

(4) Water Absorbency Measurement

Each 100 μm thick plate was cut to a 3×5 cm strip to provide a test piece. The test piece was dried at 150° C. for 5 hours and then its weight W1 was measured. Next, the test piece was soaked with water, placed in boiled water at 100° C. for 1 hour, taken out and then carefully wiped at its surface using a waste cloth. Thereafter, its weight W2 was measured. The water absorbency was calculated from the following equation:

Water absorbency (%)=($W2-W1$)/$W1$×100

(5) Measurement of Dielectric Constant

The dielectric constant at a frequency around 1 MHz was measured using an impedance measurement instrument (product of HP Company, HP 4291B).

(6) Measurement of Tensile Modulus

The tensile modulus was measured by a method according to JIS K6301.

(7) Measurement of Solubility Parameter

The solubility parameter was calculated using a Fedors equation.

(8) Measurement of 10% Weight Loss Temperature

A sample, weighing 5-10 mg, was dried at 150° C. for 5 hours and then measured using a TG/DTA instrument (Seiko Instruments, Inc.) under the following measurement conditions:

Measurement temperature: 25-600° C.;

Heating rate: 10° C./min; and

Nitrogen gas: 200 ml/min.

TABLE 1

|  |  | Ex. 1 | Comp. Ex. 1 | Ex. 2 | Comp. Ex. 2 | Ex. 3 | Comp. Ex. 3 | Ex. 4 | Comp. Ex. 4 |
|---|---|---|---|---|---|---|---|---|---|
| Bisphenol F Epoxy Resin | EPICLON830LVP | 54.0 | 54.0 | 0.0 | 0.0 | 0.0 | 0.0 | 0.0 | 0.0 |
| Bisphenol A Epoxy Resin | DER331L | 0.0 | 0.0 | 40.0 | 40.0 | 56.0 | 56.0 | 24.0 | 24.0 |
| Solid Epoxy Resin | YP55 | 0.0 | 0.0 | 40.0 | 40.0 | 24.0 | 24.0 | 56.0 | 56.0 |
| BT Resin | BT2100B | 14.7 | 14.7 | 0.0 | 0.0 | 0.0 | 0.0 | 0.0 | 0.0 |
| Neopentyl Glycol Diglycidyl Ether |  | 14.7 | 14.7 | 0.0 | 0.0 | 0.0 | 0.0 | 0.0 | 0.0 |
| γ-Glycidoxypropyl Trimethoxysilane | A-187 | 1.9 | 1.9 | 0.0 | 0.0 | 0.0 | 0.0 | 0.0 | 0.0 |
| Acetylacetone Iron |  | 1.0 | 1.0 | 0.0 | 0.0 | 0.0 | 0.0 | 0.0 | 0.0 |
| Dicyandiamide |  | 0.0 | 0.0 | 2.8 | 2.8 | 3.9 | 3.9 | 1.7 | 1.7 |
| Modified Imidazole |  | 0.0 | 0.0 | 1.2 | 1.2 | 1.7 | 1.7 | 0.7 | 0.7 |
| Swelling Fluorine Mica | SOMASIF MAE-100 | 13.7 | 0.0 | 0.0 | 0.0 | 0.0 | 0.0 | 0.0 | 0.0 |
| Synthetic Hectorite | LUCENTITE STN | 0.0 | 0.0 | 16.0 | 0.0 | 30.0 | 0.0 | 20.0 | 0.0 |
| Whisker | ALBOREX YS3A | 0.0 | 0.0 | 0.0 | 0.0 | 0.0 | 0.0 | 10.0 | 10.0 |
| Silica | ADMAFINE S0-E2 | 0.0 | 0.0 | 0.0 | 0.0 | 22.0 | 52.0 | 0.0 | 0.0 |
| Magnesium Hydroxide | KISUMA 5J | 0.0 | 0.0 | 0.0 | 0.0 | 0.0 | 0.0 | 22.0 | 42.0 |
| Methyl Ethyl Ketone |  | 200.0 | 200.0 | 0.0 | 0.0 | 0.0 | 0.0 | 0.0 | 0.0 |
| Dimethyl Formamide |  | 0.0 | 0.0 | 400.0 | 400.0 | 250.0 | 250.0 | 250.0 | 250.0 |

TABLE 2

|  |  | Ex. 1 | Comp. Ex. 1 | Ex. 2 | Comp. Ex. 2 | Ex. 3 | Comp. Ex. 3 | Ex. 4 | Comp. Ex. 4 |
|---|---|---|---|---|---|---|---|---|---|
| α2 | × 10E−5(° C.) | 13.9 | 17.4 | 13.5 | 18.1 | 7.1 | 17.5 | 6.5 | 16.8 |
| α2/α1 |  | 1.83 | 2.18 | 1.85 | 2.24 | 1.28 | 2.18 | 1.12 | 2.33 |
| 50-100° C. Mean Linear Expansion Coefficient | × 10E−5(° C.) | 7.1 | 8.0 | 7.3 | 8.1 | 5.8 | 7.8 | 5.5 | 8.2 |
| 200-240° C. Mean Linear Expansion Coefficient | × 10E−5(° C.) | 9.9 | 50< | 10.2 | 50< | 6.0 | 50< | 6.2 | 50< |
| Mean Linear Expansion Coefficient Ratio (1) |  | 1.42 | 2.45 | 1.40 | 2.48 | 1.15 | 2.60 | 1.2 | 2.6 |
| (2) |  | 0.35 | 10< | 0.42 | 10< | 0.36 | 10< | 0.34 | 10< |
| Change Rate | % | 2.25 | 5< | 2.43 | 5< | 2.10 | 5< | 2.02 | 5< |
| Mean Linear Expansion Coefficient Ratio (3) |  | 1.0273 | 1.05< | 1.0248 | 1.05< | 1.0222 | 1.05< | 1.0198 | 1.05< |
| Improvement Factor | % | 0.75 | 0.98< | 0.68 | 0.98< | 0.66 | 0.98< | 0.60 | 0.98< |
| Tensile Modulus | MPa | 22.5 | 9.2 | 17.4 | 8.6 | 27.1 | 8.8 | 28.2 | 8.2 |
| Water Absorbency | % | 1.10 | 3.20 | 0.90 | 3.35 | 0.82 | 2.20 | 0.91 | 2.63 |
| Dielectric Constant (@1 MHz) Before Water Absorption |  | 3.6 | 3.6 | 3.5 | 3.5 | 3.3 | 3.4 | 3.3 | 3.4 |
| After Water Absorption |  | 4.1 | 5.2 | 3.8 | 5.1 | 4.0 | 5.4 | 4.0 | 4.5 |
| Insulation Resistance Value | Ω | 10E+8< | 10E+8< | 10E+8< | 10E+8< | 10E+8< | 10E+8< | 10E+8< | 10E+8< |
| Tg | ° C. | 110.0 | 103.0 | 115.0 | 105.0 | 125.0 | 112.0 | 111.0 | 106.0 |
| Breaking Extension @260° C. | % | 10< | 10< | 10< | 10< | 10< | 10< | 10< | 10< |
| Solubility Parameter | [J/cm$^3$]$^{1/2}$ | 42< | 42< | 42< | 42< | 42< | 42< | 42< | 42< |
| 10% Weight Loss Temp. | ° C. | 400< | 400< | 400< | 400< | 400< | 400< | 400< | 400< |
| Inorganic Compound Mean Interlayer Spacing | nm | 3.5< | — | 3.5< | — | 3.5< | — | 3.5< | — |
| *1) | % | 10< | — | 10< | — | 10< | — | 10< | — |

*1) Proportion of the Organic Compound that is Dispersed in the Form of a Stack Consisting of 5 or Less Layers
(× 10E−5° C. Represents × $10^{-5}$° C.)

UTILITY IN INDUSTRY

In accordance with the present invention, a resin composition, substrate material, sheet, laminated board, resin-bearing copper foil, copper-clad laminate, TAB tape, printed circuit board, prepreg and adhesive sheet can be provided which are all excellent in mechanical properties, dimensional stability, heat resistance and flame retardance, particularly in high-temperature physical properties.

The invention claimed is:

1. A resin composition containing:
    100 parts by weight of a thermosetting resin being at least one selected from the group consisting of an epoxy resin, a thermosetting modified polyphenylene ether resin, a thermosetting polyimide resin, a silicone resin, a benzoxazine resin, and a melamine resin;
    0.1-65 parts by weight of an inorganic compound; and
    one or more curing agents, catalysts or initiators, as required to increase the molecular weight of the thermosetting resin and finally form a cured product of the resin composition having a three-dimensional network structure,
    wherein said inorganic compound comprises a layered silicate being dispersed in the thermosetting resin such that stacks of the layered silicate have a mean interlayer spacing of between 3 to 5 nm along (001) plane within said cured product; and
    wherein said cured product has a mean linear expansion coefficient (α2) of up to $17×10^{-5}$(° C.$^{-1}$) over a temperature range of from 10° C. higher than a glass transition temperature of said cured product to a temperature 50° C. higher than the glass transition temperature of said cured product.

2. The resin composition as recited in claim 1, wherein said cured product has a mean linear expansion coefficient ratio ($\alpha 2/\alpha 1$) of up to 2, where said mean linear expansion coefficient ratio is calculated by dividing the mean linear expansion coefficient ($\alpha 2$) over the temperature range from a temperature 10° C. higher than the glass transition temperature of said cured product of said resin composition to a temperature 50° C. higher than the glass transition temperature of the cured product of said resin composition by a mean linear expansion coefficient ($\alpha 1$) over the temperature range from a temperature 50° C. lower than the glass transition temperature of said cured product to a temperature 10° C. lower than the glass transition temperature of said cured product.

3. The resin composition as recited in claim 1, wherein said cured product has a mean linear expansion coefficient which does not exceed $10 \times 10^{-5}$ (° C.$^{-1}$) over the 50-100° C. temperature range and which does not exceed $25 \times 10^{-5}$ (° C.$^{-1}$) over the 200-240° C. temperature range.

4. The resin composition as recited in claim 1, wherein said cured product has a mean linear expansion coefficient ratio (1) of up to 2.5 and a mean linear expansion coefficient ratio (2) of up to 4.5, where the former ratio is calculated by dividing a mean linear expansion coefficient over the 150-200° C. temperature range by the mean linear expansion coefficient over the 50-100° C. temperature range and the latter ratio is calculated by dividing a mean linear expansion coefficient over the 250-300° C. temperature range by the mean linear expansion coefficient over the 50-100° C. temperature range.

5. The resin composition as recited in claim 1, wherein said cured product has a rate of change of up to 5%, where the rate of change is calculated by dividing a change in length of a resin piece comprised of said cured product when heated from 25-300° C. by a length of said resin piece at 25° C.

6. The resin composition as recited in claim 1, wherein said cured product has a value of up to 1.05 for a mean linear expansion coefficient ratio (3) as determined by the following equation (1):

mean linear expansion coefficient ratio (3)=mean linear expansion coefficient over the ($\alpha$+40)-($\alpha$+60)° C. range/mean linear expansion coefficient over the $\alpha$-($\alpha$+20)° C. range        equation (1);

wherein $\alpha$(° C.) is between 50° C. and 400° C. and the cases where the mean linear expansion coefficient ratio (3) is determined over a temperature range across Tg are excluded.

7. The resin composition as recited in claim 1, wherein said cured product has an improvement factor of up to 0.98, wherein the improvement factor is determined by dividing the mean linear expansion coefficient over the temperature range from a temperature 10° C. higher than the glass transition temperature of said cured product to a temperature 50° C. higher than the glass transition temperature of said cured product by a mean linear expansion coefficient over the temperature range from a temperature 10° C. higher than a glass transition temperature of said cured product to a temperature 50° C. higher than the glass transition temperature of said cured product.

8. The resin composition as recited in claim 1, wherein said cured product has a tensile modulus at 140° C. of 10 MPa or above and a dielectric constant at 1 MHz of 4.5 or below.

9. The resin composition as recited in claim 1, wherein said cured product has a water absorbency of 2.0% or below.

10. The resin composition as recited in claim 1, wherein said cured product has a water absorbency of 2.0% or below, a dielectric constant at 1 MHz of up to 4.5 and a dielectric constant after water absorption of up to 5.0.

11. The resin composition as recited in claim 1, wherein said cured product, when formed into a 25 μm thick resin sheet, exhibits an insulation resistance of at least $10^8 \Omega$.

12. The resin composition as recited in claim 1, wherein said cured product has a glass transition temperature of 100° C. or above.

13. The resin composition as recited in claim 1, wherein said cured product has a breaking extension at 260° C. of at least 10%.

14. The resin composition as recited in claim 1, wherein said cured product has a glass transition temperature of 100° C. or above and a dielectric constant at 1 MHz of up to 4.5.

15. The resin composition as recited in claim 1, wherein said cured product has a solubility parameter of 42 $(J/cm^3)^{1/2}$ or above, when calculated using a Fedors equation.

16. The resin composition as recited in claim 1, wherein said thermosetting resin exhibits a 10% weight loss temperature of 400° C. or above, based on its weight at 25° C., in the thermogravimetric measurement under the nitrogen atmosphere.

17. The resin composition as recited in claim 1, wherein said inorganic compound further comprises whisker.

18. The resin composition as recited in claim 1, wherein said layered silicate is at least one selected from the group consisting of montmorillonite, hectorite, swelling mica and vermiculite.

19. The resin composition as recited in claim 1, wherein said layered silicate contains an alkyl ammonium ion having 6 or more carbon atoms in the alkyl, aromatic quaternary ammonium ion or heterocyclic quaternary ammonium ion.

20. The resin composition as recited in claim 1, wherein said layered silicate is dispersed in the thermosetting resin such that and a part or all of said stacks consists of 5 or less layers.

21. A substrate material comprising a cured product of said resin composition as recited in claim 1.

22. A sheet comprising a cured product of said resin composition as recited in claim 1.

23. An adhesive sheet comprising a cured product of said resin composition as recited in claim 1.

24. An optical circuit forming material comprising a cured product of said resin composition as recited in claim 1.

* * * * *